United States Patent [19]
Huang et al.

[11] Patent Number: 5,857,619
[45] Date of Patent: Jan. 12, 1999

[54] APPARATUS AND METHOD FOR BREAKING UP BUBBLES IN A LIQUID FLOW

[75] Inventors: Cheng-Hsiang Huang, I-lan; Te-Yun Liu, Hsin-chu, both of Taiwan

[73] Assignee: Taiwan Semiconductor Manufacturing Co., Ltd., Hsin-Chu, Taiwan

[21] Appl. No.: 907,724

[22] Filed: Aug. 8, 1997

[51] Int. Cl.⁶ ........................................... B05B 17/04
[52] U.S. Cl. ........................ 239/11; 239/590.5; 134/153
[58] Field of Search .............................. 239/11, 499, 502, 239/589, 590, 590.5; 134/153, 902

[56] References Cited

U.S. PATENT DOCUMENTS 1,366,685  1/1921  Wilson .............................. 239/590.5 X

FOREIGN PATENT DOCUMENTS 2436726  4/1980  France ................................. 239/590.5
3407871  9/1984  Germany ............................. 239/590.5

Primary Examiner—Andres Kashnikow
Assistant Examiner—Steven J. Ganey
Attorney, Agent, or Firm—Tung & Associates

[57] ABSTRACT

The present invention discloses an apparatus and a method for breaking up air bubbles in a liquid flow which is conveyed in a fluid conduit by providing sharp protuberances on the inside wall of the conduit. The sharp protuberances break up large air bubbles into small air bubbles or micro-bubbles such that they can be easier disposed of after passing through a liquid dispensing nozzle. Various designs on the inner wall of the present invention fluid conduit can be provided as long as sharp protuberances exist for dividing the bubbles.

19 Claims, 2 Drawing Sheets

5,857,619

APPARATUS AND METHOD FOR BREAKING UP BUBBLES IN A LIQUID FLOW

FIELD OF THE INVENTION

The present invention generally relates to an apparatus and a method for breaking up bubbles in a liquid flow which is being conveyed in a fluid conduit and more particularly, relates to an apparatus and a method for breaking up bubbles contained in a liquid flow by equipping an inside wall of a fluid conduit through which the liquid is being conveyed with sharp protuberances that are spaced at a regular or irregular intervals such that bubbles are broken up by such sharp protuberances into micro-bubbles which are capable of passing through a liquid dispensing nozzle.

BACKGROUND OF THE INVENTION

In semiconductor processing, a semi-conducting wafer must be processed in a multiplicity of fabrication steps, i.e., as many as several hundred steps, in order to complete the manufacturing of an IC device. These processing steps may include etching, cleaning, deposition and various other processing procedures. A variety of chemicals, including various liquids and gases may be used in the processing steps either to etch a specific feature on the IC chip, to clean after certain processing steps, to deposit layers from reactant chemicals, or to carry out other necessary processing steps.

For instance, in photomasking and metal cleaning processes, a variety of speciality chemicals are used. An important requirement for such speciality chemicals, i.e., photoresists, developers, spin-on glass and polyimide is the transporting and storage of the materials. In the case of a photoresist material, the photosensitivity and the lifetime of such material depends on its storage temperature. It is important to maintain such materials within a specification of 5° to 20° C. for a photoresist/developer and −20° to 10° C. for spin-on glass/polyimide materials.

The transporting of these speciality chemicals, especially liquids, or the delivery from a storage reservoir (i.e., a holding tank) to a processing chamber where the liquid is used is another important aspect of the fabrication process. A process liquid, such as that of a photoresist or a developer, can normally be transported in a fluid passage such as a stainless steel tubing by an electrical pump means. One of such conventional liquid delivery system for a photoresist is shown in FIG. 1.

As shown in FIG. 1, a photoresist delivery system 10 is shown in an illustration for the present invention novel method and apparatus. The photoresist delivery system 10 generally consists of a liquid reservoir 12 (or a holding tank), a nitrogen gas inlet 14, and a photoresist solution outlet 16. The nitrogen gas used is normally a dry nitrogen gas to pressurize the liquid reservoir 12. The liquid flow 18 out of the reservoir 12 which is pumped by an electric pump 32 assisted by the nitrogen pressure in the reservoir 12 first enters into a buffer tank 22 through inlet 24. The buffer tank 22 is used to regulate flow from the reservoir 12 and is also capable of separating a small amount of air bubbles in the liquid. A small amount of air bubbles can be exhausted from outlet 26 while liquid is fed through outlet 28 generally located at the bottom of the buffer tank 22 into an air controlled solenoid valve 34. The small amount of air bubbles exits outlet 26 on the buffer tank 22 and enters into a drain tank (not shown) through passageway 36. The air controlled solenoid valve 34 controlled by an air supply 38 regulates the amount of liquid that can be pumped through passageway 42.

In the conventional liquid dispensing line shown in FIG. 1, a second liquid reservoir tank (not shown) can also be used as a back-up supply for feeding into the electric pump 32 connected in parallel with the first liquid reservoir 12. A liquid flow 44 fed from the second liquid reservoir tank (not shown) enters into a second air controlled solenoid valve 46 controlled by the same air source 38 through passageway 48 into the electric pump 32. It should be noted that the first liquid reservoir 12 and the second liquid reservoir operate in an alternating fashion such that the refill or maintenance of one liquid reservoir can be conducted at anytime without interrupting the normal operation of the liquid dispensing line. The dual reservoir system therefore eliminates potential down time of the dispensing line.

The electric pump 32, assisted by dry nitrogen gas 52 pumps liquid flow 54 into a filter device 56. The filter device may also serve as an air bubble filter such that liquid flow 58 containing a small amount of air bubbles may exit the filter at outlet 60 into a drain tank 62. The liquid flow 58 is controlled by another air solenoid valve 64. A flow of the photoresist solution 66, controlled by a flow regulator 68 and a series of air pressure controllers 72 can be fed to a nozzle for the final dispensing of the photoresist solution through passageway 74.

During normal operations, a small amount of air bubbles can be purged out by the buffer tank 22 and the filter 56. However, when a large volume of air bubbles is generated, for instance, during a maintenance procedure of filter replacement or a refill of the photoresist solution in the holding tank 12, the buffer tank 22 and the filter 56 can no longer effectively exhaust the air bubbles. As a result, a flow of the photoresist solution 74 which contains a volume of air bubbles is applied to the surface of a wafer.

When a wafer surface is coated with a photoresist solution, the volume of the photoresist material deposited and the resulting photoresist film formed must be quantitatively controlled to a high accuracy. Since the presence of air bubbles in the photoresist solution decreases the amount of the photoresist material, the available photoresist material that can be applied to the wafer surface is reduced accordingly by the amount of the bubbles. A non-uniform coating and subsequently a defective pattern can be produced on the wafer. The flow regulating valve 68, also called a suckback valve, is designed to shut off the liquid flow or to suckback the flow when bubbles are detected flowing through the passageway 66. However, the valve 68 is not always effective in stopping the air bubbles. Furthermore, valve 68 sometimes causes the photoresist solution to drop onto the wafer surface after a normal dispensing time has lapsed and thus again causing a poor coating of the photoresist material.

It is therefore an object of the present invention to provide an apparatus for breaking up bubbles in a liquid flow in a conduit that does not have the drawbacks and the shortcomings of the conventional bubble-eliminating apparatus.

It is another object of the present invention to provide an apparatus for breaking up bubbles in a liquid flow which is being conveyed in a conduit by providing a plurality of sharp protuberances on the inside wall of the conduit.

It is a further object of the present invention to provide an apparatus for breaking up bubbles in a liquid flow which is being conveyed in a conduit by providing a plurality of sharp protuberances that are spaced apart at different spacings on the inside wall of the conduit for breaking up the bubbles.

It is still another object of the present invention to provide an apparatus for breaking up bubbles in a liquid flow which is being conveyed in a conduit by providing a plurality of sharp protuberances on the inside wall of the conduit having a larger spacing between the protuberances at the end of the fluid inlet and a smaller spacing between the protuberances at the outlet of the fluid conduit.

It is yet another object of the present invention to provide an apparatus for breaking up bubbles in a liquid flow which is being conveyed in a conduit by using a plurality of sharp protuberances of the inside wall of the conduit wherein the protuberances having a tip portion of an angle smaller than 30° when viewed in a plane perpendicular to the circumferential direction of the conduit.

It is another further object of the present invention to provide an apparatus for breaking up bubbles in a fluid flow which is conveyed in a multi-section conduit by providing a plurality of sharp protuberances in each section of the conduit.

It is still another further object of the present invention to provide an apparatus for breaking up bubbles in a liquid flow that is conveyed in a multi-section conduit by providing a plurality of sharp protuberances in each section of the conduit with larger spacings between the protuberances in the inlet section of the conduit and smaller spacing between the protuberances in the outlet section of the conduit.

It is yet another further object of the present invention to provide a method for breaking up bubbles in a liquid flow which is being conveyed in a conduit by first providing a conduit that has a plurality of sharp protuberances on the inside wall of the conduit for breaking up bubbles into micro-bubbles having diameters that are sufficient to pass through a liquid dispensing nozzle and then flowing a liquid through such fluid conduit and the liquid dispensing nozzle.

SUMMARY OF THE INVENTION

In accordance with the present invention, an apparatus and a method for breaking up bubbles in a liquid flow which is being conveyed in a conduit can be provided which is capable of breaking up large bubbles by a series of sharp protuberances provided on the inside wall of the conduit into micro-bubbles such that they can pass through a liquid dispensing nozzle without causing processing difficulties are provided.

In a preferred embodiment, an apparatus for breaking up bubbles in a liquid flow which is being conveyed in a conduit is provided which includes a fluid conduit that has generally an extended dimension in a longitudinal direction, the fluid conduit has a boundary constructed of an outer wall and an inner wall for containing a liquid being conveyed therein, the fluid conduit further includes an inlet end which is in fluid communication with a fluid reservoir and an outlet end which is in fluid communication with a liquid dispensing nozzle, and an inner wall for the fluid conduit that is juxtaposed to the outer wall in construction and has sharp protuberances on the surface that contacts a liquid flow and a pitch between the protuberances, the pitch between the protuberances varies between a maximum value at the inlet end and a minimum value at the outlet end, the protuberances break-up bubbles contained in the liquid flow into micro-bubbles such that substantially all micro-bubbles pass through the liquid dispensing nozzle.

In an alternate embodiment, an apparatus for breaking up bubbles in a liquid flow that is being conveyed in a conduit is provided which includes a fluid conduit that has a longitudinal axis and at least a first section and a second section connected together in a leak-proof manner along the axis, an inner wall in the first section of the fluid conduit constructed by a first series of protuberances that have a first pitch between the first series of protuberances, and an inner wall in the second section of the fluid conduit constructed by a second series of protuberances that have a second pitch between the second series of protuberances, the second pitch is smaller than the first pitch, the first series and the second series of protuberances break up bubbles contained in the liquid flow into bubbles of sizes that are sufficiently small to pass through a liquid dispensing nozzle connected to an outlet and of the second section of the fluid conduit.

The present invention is further directed to a method for breaking up bubbles in a liquid flow that is being conveyed in a fluid conduit by the operating steps of first providing a fluid conduit that has generally an extended longitudinal dimension and a boundary constructed of an outer wall for containing a liquid that is being conveyed therein, the fluid conduit further having an inlet end that is in fluid communication with a fluid reservoir and an outlet end that is in fluid communication with a liquid dispensing nozzle, the inner wall for the fluid conduit is juxtaposed to the outer wall in construction and has sharp protuberances on its surface which contacts a liquid flow and a pitch between the protuberances, the pitch between the protuberances varies between a maximum value at the inlet end and a minimum value at the outlet end, the protuberances break-up bubbles contained in the liquid flow into micro-bubbles such that substantially all micro-bubbles can pass through the liquid dispensing nozzle, and then flowing a fluid flow containing bubbles through the fluid conduit.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND THE ALTERNATE EMBODIMENTS

The present invention discloses a apparatus and a method for breaking up bubbles contained in a liquid flow which is conveyed in a fluid conduit. The apparatus consists of a fluid conduit that has an inner wall equipped with a plurality of sharp protuberances for breaking up bubbles. The fluid conduit can be conveniently provided in a single piece construction, or can be suitably provided in a multiple-sectioned construction wherein each section has protuberances arranged at different spacings from each other.

In coating a wafer surface with a photoresist liquid, the presence of air bubbles is frequently a major cause of poor coating problem on the wafer. A poor coating of photoresist layer on the surface of a wafer leads to subsequent defect formations such as voids, insufficient thickness of the photoresist layer and thus poor formation of the device intended. These quality problems caused by the poor coating of photoresist liquid on the wafer surface thus lead to a poor quality wafer and a low yield in the chips produced from the wafer. It has generally been found that the larger the size of the air bubble contained in a photoresist liquid, the more likely is the occurrence of poor coating on the surface of the wafer. The present invention novel apparatus for breaking up bubbles in a liquid flow is capable of dividing large size bubbles into smaller size bubbles and eventually, into microbubbles that have sizes of generally smaller than 1/16 inch. Since a liquid dispensing nozzle frequently utilized in a photoresist coating apparatus, such as that shown in FIG. 2, has an opening of 1/16 inch diameter, the micro-bubbles can usually pass through the nozzle opening and be either dispersed in the surrounding air or vaporized from the surface of a wafer after it is deposited.

In the wafer fabrication process, prior to the wafer being coated by a photoresist liquid, dehydration process and wafer priming process are usually necessary to ensure a hydrophobic surface on the wafer and thus superior photoresist adhesion. To dry the wafer surface, a dehydration baking process is frequently used by heating the wafer at about 220° C. for a time period for more than thirty minutes. Any residual water and other volatile organic contaminants may evaporate from the surface. The wafer is then immediately placed in a photoresist coating apparatus after the dehydration baking process to avoid the deposition of more water on the surface of the wafer.

After the dehydration baking process, a silicon wafer surface is usually treated with an adhesion promoter to replace the —OH groups in silanol groups with an organic radical for improving adhesion to photoresist. A commonly used adhesion promoter for silicon wafer surface is hexamethyldisilazane. It can be applied to a wafer surface in a vapor form at an elevated temperature and reduced atmospheric pressure.

Figure 1:
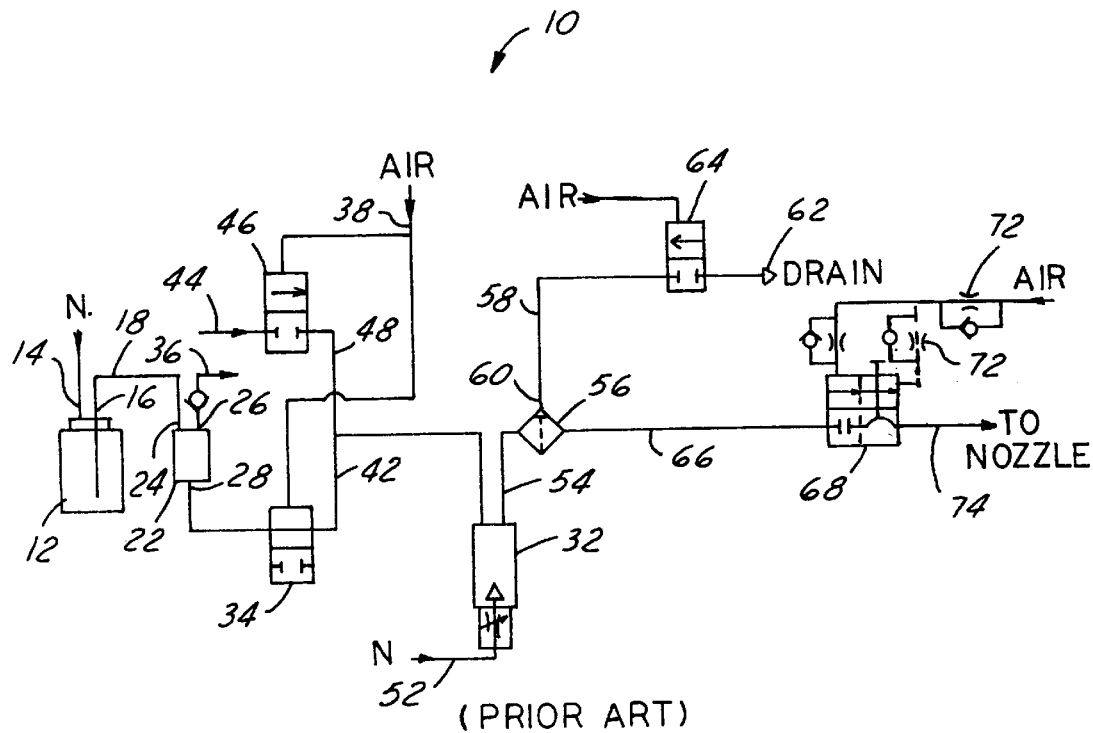
FIG. 1 is a schematic illustrating a conventional liquid dispensing system for a photoresist solution.
Figure 2:
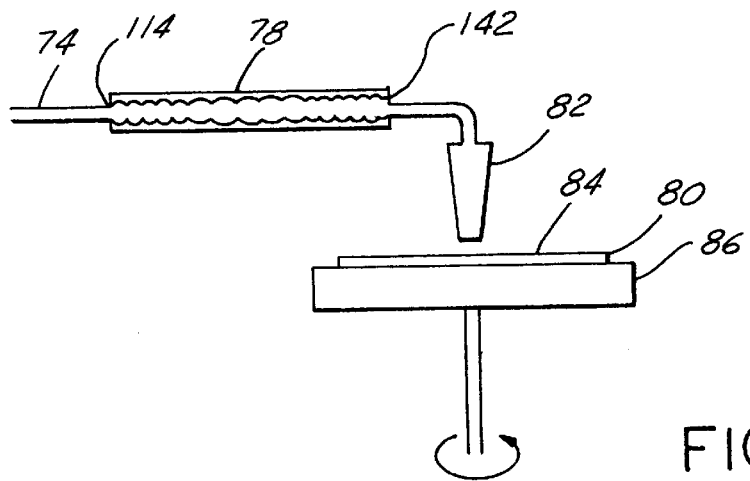
FIG. 2 is a perspective view of the present invention utilized in a wafer spin coater.

The wafer is then placed in one of many different types of photoresist coating apparatus for the coating of a photoresist layer. One commonly used method for coating a silicon wafer with photoresist is to deposit a small amount, i.e., a few cubic centimeter, of liquid photoresist material from a moving-arm type dispensing nozzle which moves slowly from the wafer center toward its edge while the wafer rotates at a slow speed. A suitable speed for depositing photoresist liquid on the surface of a wafer is approximately 1,000 rpm. After the photo resist liquid is dispensed on a surface of a wafer 80, as shown in FIG. 2, the wafer pedestal 86 rotates at a higher speed of between 3,000~5,000 rpm for spreading out the photo resist liquid on the wafer surface evenly for a time of approximately 30 seconds. By suitably adjusting the rotational speed of the wafer and the amount of photo resist material dispensed, a desirable photo resist thickness can be controlled within tight specifications. For the surface of a silicon wafer, typical thicknesses of coating achieved is between about 0.5 $\mu$m and about 1.5 $\mu$m across the flat surface of a silicon wafer. The thickness achieved normally increases with the percent solid contained in the photo resist liquid, i.e., or its viscosity, and decreases with higher spinning speed of the wafer.

Figure 3:
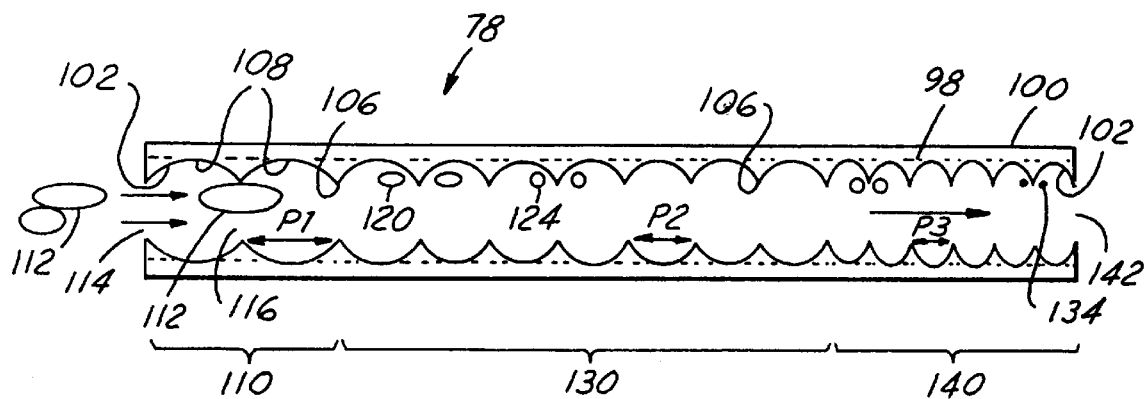
FIG. 3 is an enlarged, cross-sectional view of the present invention apparatus for breaking up bubbles shown in a preferred embodiment.

An enlarged, cross-sectional view of the present invention apparatus 78 for breaking up large air bubbles is shown in FIG. 3. It is seen that in the apparatus 78, a tubular shaped fluid conduit which is constructed by an outer wall 100 and an inner wall 102 is provided. As shown in FIG. 3, the inner wall 102 is constructed by a plurality of sharp protuberances 106 that are spaced at different intervals. The intervals can be more suitably called a pitch between the protuberances 106. The pitch is shown in FIG. 3 as P1, for the largest pitch, P2 for the intermediate pitch and P3 for the smallest pitch. In the construction of the fluid conduit 78 shown in FIG. 3, three separate sections of the conduit are used in the construction. In the first section, where the pitch is shown as P1 wherein the sharp protrubances 106 are formed by the boundary of two semispherical sections 108. It should be noted that the semispherical sections 108 is a continuous section throughout the circumferential direction of the conduit 78. The sharp protuberances 106 formed is therefore also continuous around the interior periphery of the inner wall 102. The semispherical sections 108 is shown to demonstrate one possible embodiment of the present invention. Any other suitable cross-sectional areas, other than the semispherical section, can be suitably used as long as a sharp protuberance 106 is formed at their boundaries. In the section 110 where the pitch P1 is the largest, air bubbles 112 of large volume enters into the conduit 78 through an inlet 114 of the conduit. Based on the density difference between the air bubbles 112 of large volume enters into the conduit 78 through an inlet 114 of the conduit. Based on the density difference between the air bubbles 112 and the photo resist liquid 116, the air bubbles 112 float on top of the liquid flow and thus caught by the sharp protuberance 106 and broken up as smaller air bubbles 120. In the section 110, the pitch P1 shown in FIG. 3 is approximately half of the outside diameter of the outer tube 100 of the conduit 78. The pitch distance P1 can be selected of any other values as long as sharp protuberances 106 are formed to adequately to break up large air bubbles 112.

In the next section 130 of the fluid conduit 78, a smaller pitch is used to form their semispherical sections in the inner wall 102 of the conduit 78. Smaller air bubbles 102 which were broken up by the sharp protuberances existed in the section 110, are further broken up by the sharp protuberances 106 into smaller air bubbles 124. In the section 130, the pitch different distance P2 may be suitably selected as 1/4 of the outside diameter of the outer wall 100. Further down the liquid pass, the pitch distance is further reduced to P3 in the last section 140 of the fluid conduit 78. The sharp protuberances 106 in section 140 further reduces the air bubble size to micro-bubbles 134. The term micro-bubbles is used here to illustrate air bubbles that generally have a diameter of less than 3 1/16 inch diameter. The liquid flow 116 then exits the fluid conduit 78 at an outlet 142 into a liquid dispensing nozzle 82 (shown in FIG. 2).

The fluid conduit 78 can be suitable fabricated of a plastic material or any other metallic materials. When fabricated by a plastic material, an injection molding process can be used to mold the semispherical indentations on the inside wall of the conduit. In a normal photo resist coating apparatus, the fluid conduit 78 may have a diameter of approximately 3/8 inch. However, the present invention apparatus of fluid conduit can be of any size between about 1/4 inch to about 3/1 inch. The length of the fluid conduit 78 may be suitably selected as required to eliminate large air bubbles into micro-bubbles. A suitable length may be larger than 6 inch. It is generally believed that the longer the fluid conduit, to the extent feasible, the smaller the micro-bubbles can be formed.

Figure 4:
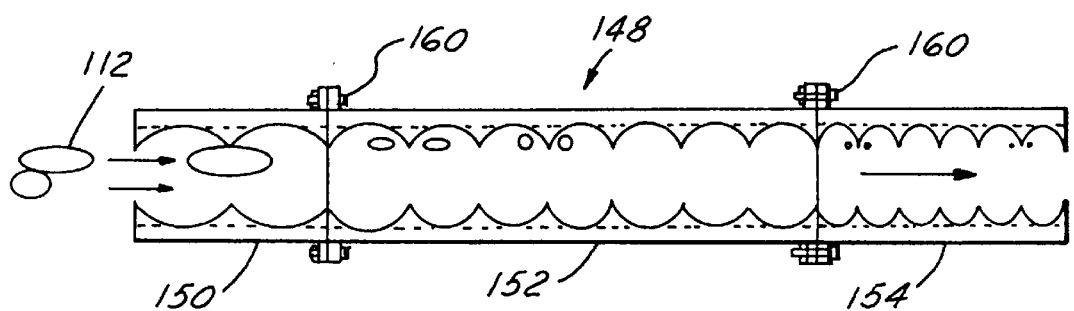
FIG. 4 is an enlarged, cross-sectional view of the present invention apparatus for breaking up bubbles shown in an alternate embodiment.

In an alternate embodiment of the present invention, as shown in FIG. 4, different sections of the fluid conduit, namely 150, 152 and 154 are mechanically connected together by a fastening means 160. The fastening means 160 shown in FIG. 4 can be suitably a flange around the fluid conduit 148 and mechanical bolts. The functioning of the fluid conduit 148 shown in FIG. 4 is the same as that shown in FIG. 3, except that the various sections of the conduit can be fabricated separately and then bolted together to form the conduit 148. This embodiment provides the benefit that the individual sections may be easier fabricated by a plastic injection molding process or a metal forming process due to the shorter length of each individual sections.

In practice, the fluid conduit that is equipped with sharp protuberances on its inner wall can be used to advantageously divide large bubbles into small micro-bubbles. After a time period of usage of the conduit, it may be desirable to purge out accumulated air bubbles during a weekly preventive maintenance procedure such that the conduit can still function efficiently.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. An apparatus for breaking up bubbles in a liquid flow in a conduit comprising:
   a fluid conduit having generally an extended dimension in a longitudinal direction,
   said fluid conduit having a boundary constructed of an outer wall and an inner wall for containing a liquid being conveyed therein,
   said fluid conduit further having an inlet end in fluid communication with a fluid reservoir and an outlet end in fluid communication with a liquid dispensing nozzle, and
   said inner wall for said fluid conduit juxtaposed to said outer wall in construction and having sharp protuberances on its surface that contacts a liquid flow and a pitch between said protuberances, said pitch between said protuberance varies between a maximum value at said inlet end and a minimum value at said outlet end, whereby said protuberances break up bubbles contained in said liquid flow into micro-bubbles such that substantially all micro-bubbles pass through said liquid dispensing nozzle.

2. An apparatus according to claim 1, wherein said protuberance are present on the surface of said inner wall in a continuous fashion in a circumferential direction.

3. An apparatus according to claim 1, wherein each of said protuberances consisting of a base portion connected to said inner wall of the fluid conduit and a tip portion protruding from said base portion in a radial direction toward a center line of said fluid conduit.

4. An apparatus according to claim 3, wherein said tip portion is formed of an angle smaller than 30° when measured in a plane perpendicularly intersecting the circumference of said fluid conduit.

5. An apparatus according to claim 1, wherein said pitch between said protuberances decreases from said maximum value to said minimum value in at least 3 stages between said inlet end and said outlet end.

6. An apparatus according to claim 5, wherein said minimum pitch is not more than ⅓ of said maximum pitch.

7. An apparatus according to claim 1, wherein said sharp protuberances on said inner wall are formed at the boundaries of generally continuous semispherical shaped concave sections when viewed in a circumferential direction.

8. An apparatus according to claim 7, wherein said semispherical shaped concave sections having a diameter of not larger than ½ of an outside diameter of said fluid conduit at the inlet end of the fluid conduit and a diameter of not larger than ¼ of the outside diameter of said fluid conduit at the outlet end of the fluid conduit.

9. An apparatus according to claim 7, wherein said semispherical shaped concave sections having a diameter substantially equal to the pitch between said protuberance.

10. An apparatus according to claim 1, wherein said inner wall and said outer wall of the fluid conduit are contiguous.

11. An apparatus according to claim 1, wherein said inner wall and said outer wall of the fluid conduit are spaced apart and positioned juxtaposed to each other.

12. An apparatus according to claim 1, wherein said fluid conduit is made of a plastic material.

13. An apparatus according to claim 1, wherein said fluid conduit is made of metallic material.

14. An apparatus for breaking up bubbles in a liquid flow being conveyed in a conduit comprising:
   a fluid conduit having a longitudinal axis and at least a first section and a second section connected together in a leak-proof manner along said axis,
   an inner wall in said first section of the fluid conduit constructed by a first series of protuberances having a first pitch between said first series of protuberances, and
   an inner wall in said second section of the fluid conduit constructed by a second series of protuberances having a second pitch between said second series of protuberances, said second pitch being smaller than said first pitch, whereby said first series and said second series of protuberances break up bubbles contained in said liquid flow into bubbles of sizes that are small sufficient to pass through a liquid dispensing nozzle connected to an outlet end of said second section of the fluid conduit.

15. An apparatus according to claim 14, wherein said fluid conduit comprises not less than three sections connected together in a leak-proof manner.

16. An apparatus according to claim 15, wherein a pitch in a third section of said fluid conduit is not more than ¼ of a pitch in a first section of said fluid conduit.

17. An apparatus according to claim 14, wherein each of said first and second series of protuberances consisting of a base portion connected to said inner wall of the fluid conduit and a tip portion protruding from said base portion in a radial direction toward a center line of said fluid conduit and wherein said tip portion in said first and second series of protuberances is formed of an angle smaller than 30° when measured in a plane perpendicular to the circumference of said fluid conduit.

18. A method for breaking-up bubbles in a liquid flow being conveyed in a fluid conduit comprising the steps of:
   providing a fluid conduit having generally a fluid conduit having generally an extended dimension in a longitudinal direction, said fluid conduit having a boundary constructed of an outer wall and an inner wall for containing a liquid being conveyed therein, said fluid conduit further having an inlet end in fluid communication with a fluid reservoir and an outlet end in fluid communication with a liquid dispensing nozzle, and said inner wall for said fluid conduit juxtaposed to said outer wall in construction and having sharp protuberances on its surface that contacts a liquid flow and a pitch between said protuberances, said pitch between said protuberance varies between a maximum value at said inlet end and a minimum value at said outlet end, whereby said protuberances break up bubbles contained in said liquid flow into micro-bubbles such that substantially all micro-bubbles pass through said liquid dispensing nozzle, and
   flowing said liquid flow containing bubbles through said fluid conduit.

19. A method according to claim 18 further comprising the step of connecting at least two sections in a leak-proof connection to form said fluid conduit.

* * * * *